United States Patent
Lee et al.

(10) Patent No.: US 9,748,290 B2
(45) Date of Patent: Aug. 29, 2017

(54) MECHANISMS FOR FORMING IMAGE SENSOR WITH LATERAL DOPING GRADIENT

(71) Applicant: Taiwan Semiconductor Manufacturing Co., Ltd, Hsin-Chu (TW)

(72) Inventors: Yueh-Chuan Lee, Hsinchu (TW); Tzo-Hung Luo, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 57 days.

(21) Appl. No.: 14/170,968

(22) Filed: Feb. 3, 2014

(65) Prior Publication Data
US 2015/0221689 A1    Aug. 6, 2015

(51) Int. Cl.
H01L 31/062    (2012.01)
H01L 31/113    (2006.01)
H01L 27/146    (2006.01)

(52) U.S. Cl.
CPC .... H01L 27/1461 (2013.01); H01L 27/14643 (2013.01); H01L 27/14689 (2013.01)

(58) Field of Classification Search
CPC ......... H01L 27/14609; H01L 27/14643; H01L 27/1461
USPC ................... 257/290–292; 438/57, 301, 302
See application file for complete search history.

(56) References Cited

U.S. PATENT DOCUMENTS

| | | | | |
|---|---|---|---|---|
| 5,258,319 | A * | 11/1993 | Inuishi | H01L 21/26586 257/344 |
| 5,372,957 | A * | 12/1994 | Liang | H01L 21/26586 257/344 |
| 7,345,703 | B2 * | 3/2008 | Lee | H01L 27/14645 257/440 |
| 7,659,564 | B2 * | 2/2010 | Adkisson | H01L 27/1463 257/293 |
| 8,815,634 | B2 * | 8/2014 | Ramappa | H01L 27/14603 438/527 |
| 2005/0006676 | A1 * | 1/2005 | Watanabe | H01L 27/14643 257/290 |
| 2005/0023553 | A1 * | 2/2005 | Rhodes | H01L 27/14609 257/162 |
| 2005/0087782 | A1 * | 4/2005 | Rhodes | H01L 27/14601 257/292 |
| 2006/0108613 | A1 * | 5/2006 | Song | H01L 27/14601 257/233 |
| 2006/0118835 | A1 * | 6/2006 | Ellis-Monaghan | H01L 27/14601 257/292 |
| 2006/0186505 | A1 * | 8/2006 | Adkisson | H01L 27/14609 257/463 |

(Continued)

*Primary Examiner* — Lex Malsawma
*Assistant Examiner* — Eric Jones
(74) *Attorney, Agent, or Firm* — Birch, Stewart, Kolasch & Birch, LLP (57) ABSTRACT

Embodiments of mechanisms for forming an image sensor device structure are provided. The image sensor device structure includes a substrate and a transfer transistor formed on the substrate. The image sensor device structure also includes a floating node formed in the substrate and a photosensitive element formed in the substrate. The transfer transistor is formed between the floating node and the photosensitive element, and the photosensitive element includes a first doping region with a lateral doping gradient.

17 Claims, 6 Drawing Sheets

(56) References Cited

U.S. PATENT DOCUMENTS

| | | | |
|---|---|---|---|
| 2007/0023800 A1* | 2/2007 | Ohkawa | H01L 27/14601 257/292 |
| 2007/0267666 A1* | 11/2007 | Park et al. | 257/292 |
| 2009/0166693 A1* | 7/2009 | Kim | H01L 27/14603 257/292 |
| 2009/0227066 A1* | 9/2009 | Joseph et al. | 438/95 |
| 2010/0203667 A1* | 8/2010 | Hirota | H01L 27/14698 438/72 |
| 2011/0177650 A1* | 7/2011 | Qian et al. | 438/75 |
| 2011/0241090 A1* | 10/2011 | Mao | H01L 21/26586 257/292 |
| 2011/0267505 A1* | 11/2011 | Dierickx | 348/241 |

* cited by examiner

MECHANISMS FOR FORMING IMAGE SENSOR WITH LATERAL DOPING GRADIENT

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

Complementary metal oxide semiconductor (CMOS) image sensors are gaining in popularity over charged-coupled devices (CCDs) due to certain advantages inherent in the CMOS image sensors. In particular, CMOS image sensors having lower voltages, consume less power, enable random access to image data, may be fabricated with compatible CMOS processes, and enable integrated single-chip cameras.

CMOS image sensors utilize light-sensitive CMOS circuitry to convert light energy into electrical energy. The light-sensitive CMOS circuitry includes a photodiode formed in a silicon substrate. As the photodiode is exposed to light, an electrical charge is induced in the photodiode. The photodiode is coupled to a MOS switching transistor, which is used to sample the charge of the photodiode. Colors may be determined by placing filters over the light-sensitive CMOS circuitry.

However, there are many challenges related to forming image sensors.

BRIEF DESCRIPTION OF THE DRAWINGS

For a more complete understanding of the present disclosure and the advantages thereof, reference is now made to the following descriptions taken in conjunction with the accompanying drawings.

DETAILED DESCRIPTION OF THE ILLUSTRATIVE EMBODIMENTS

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Figure 1:
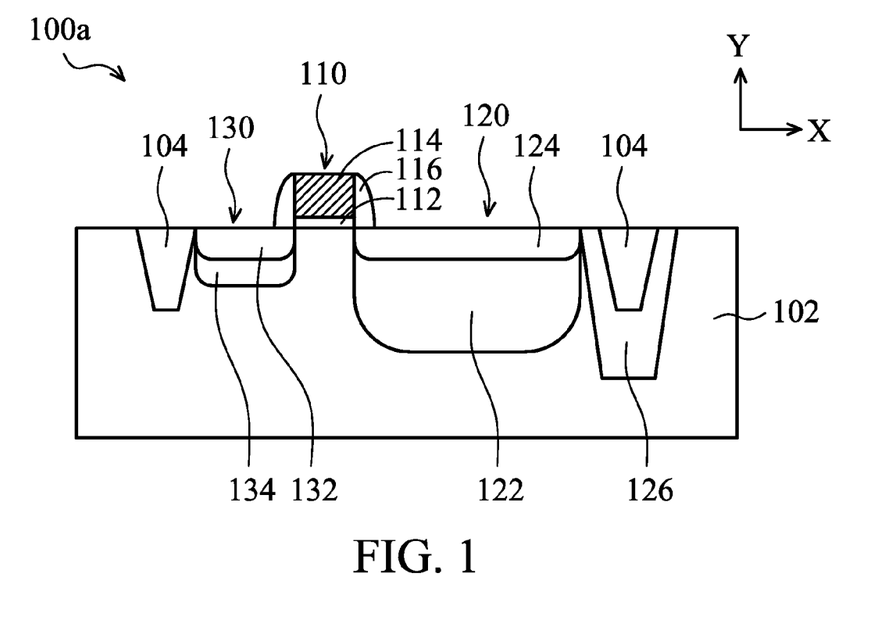
FIG. 1 shows a cross-sectional representation of an image sensor device structure, in accordance with some embodiments of the disclosure.

Embodiments of mechanisms for forming an image sensor device structure are provided. FIG. 1 shows a cross-sectional representation of an image sensor device structure 100a, in accordance with some embodiments of the disclosure.

Referring to FIG. 1, a substrate 102 is provided. Substrate 102 may be made of silicon or other semiconductor materials. Alternatively or additionally, substrate 102 may include other elementary semiconductor materials such as germanium. In some embodiments, substrate 102 is made of a compound semiconductor such as silicon carbide, gallium arsenic, indium arsenide, or indium phosphide. In some embodiments, substrate 102 is made of an alloy semiconductor such as silicon germanium, silicon germanium carbide, gallium arsenic phosphide, or gallium indium phosphide. In some embodiments, substrate 102 includes an epitaxial layer. For example, substrate 102 has an epitaxial layer overlying a bulk semiconductor.

Substrate 102 may further include isolation features 104, such as shallow trench isolation (STI) features or local oxidation of silicon (LOCOS) features. The isolation features 104 may define and isolate various integrated circuit devices.

As shown in FIG. 1, a transfer transistor 110 is formed on substrate 102. Transfer transistor 110 includes a gate dielectric layer 112 and a transfer gate electrode layer 114 formed on gate dielectric layer 112. Gate dielectric layer 112 is made of silicon oxide, silicon nitride, or a high dielectric constant material (high-k material). In some embodiments, gate dielectric layer 112 is formed by a chemical vapor deposition (CVD) process.

Transfer gate electrode layer 114 is made of polysilicon or conductive material. The conductive material may include metal (e.g., tantalum, titanium, molybdenum, tungsten, platinum, aluminum, hafnium, ruthenium), a metal silicide (e.g., titanium silicide, cobalt silicide, nickel silicide, tantalum silicide), or a metal nitride (e.g., titanium nitride, tantalum nitride). In some embodiments, transfer gate electrode layer 114 is formed by a chemical vapor deposition (CVD) process or physical vapor deposition (PVD) process.

Gate spacers 116 are formed on sidewalls of transfer gate electrode layer 114. In some embodiments, gate spacers 116 are made of silicon oxide, silicon nitride, silicon oxynitride or other applicable material. In some embodiments, gate spacers 116 are formed by a chemical vapor deposition (CVD) process or physical vapor deposition (PVD) process.

As shown in FIG. 1, a photosensitive element 120 is formed in substrate 102. Photosensitive element 120 may include a photodiode, partially pinned photodiode, pinned photodiode, photogate, or photocapacitor. In some embodiments, photosensitive element 120 includes a first doping region 122 and a second doping region 124. In addition, a well 126 is formed in substrate 102 and adjacent to first doping region 122. In some embodiments, first doping region 122 is an n-type region, second doping region 124 is a p-type region 124, and well 126 is a p-type well.

As shown in FIG. 1, a floating node (FD) 130 (also referred to as a floating diffusion) is adjacent to transfer transistor 110. Transfer transistor 110 is formed between photosensitive element 120 and floating node (FD) 130. In some embodiments, floating node (FD) 130 includes a lightly doped drain (LDD) region 132 and a higher doped source/drain (S/D) region 134. LDD region 132 is formed in substrate 102 on an opposing side of transfer transistor 110 from photosensitive element 120.

It should be noted that first doping region 122 has a uniform doping concentration along an X-axis direction. When transfer transistor 110 is switched on, transfer gate electrode layer 114 transfers electrons accumulated in photosensitive element 120 to floating node 130. However, there is a potential barrier between first doping region 122 to floating node 130. Therefore, an image lag problem is produced. Furthermore, dark current and white pixel defects are also increased. In order to resolve the image lag problem, some embodiments are provided.

Figure 2:
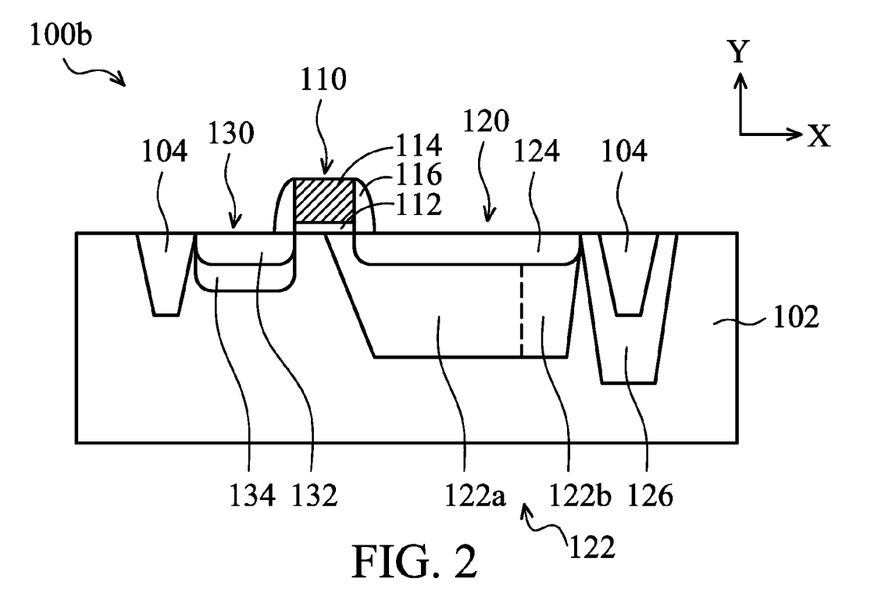
FIG. 2 shows a cross-sectional representation of an image sensor device structure, in accordance with some embodiments of the disclosure.

FIG. 2 shows a cross-sectional representation of an image sensor device structure 100b, in accordance with some embodiments of the disclosure. FIG. 2 is similar to FIG. 1, with the difference between FIG. 2 and FIG. 1 being that first doping region 122 has a lateral doping gradient along X-axis direction.

As shown in FIG. 2, first doping region 122 includes a first doping portion 122a and a second doping portion 122b. Second doping portion 122b is farther away from transfer transistor 110 than first doping portion 122, and first doping portion 122a has a higher doping concentration than second doping portion 122b. In other words, first doping region 122 has a doping concentration decreasing from first doping portion 122a below transfer transistor 110 to second doping portion 122b away from transfer transistor 110.

In some embodiments, first doping region 122 is doped with an n-type dopant, such as arsenic (As), phosphorous (P) or antimony (Sb). In some embodiments, first doping portion 122a has a doping concentration in a range from about 3E12 atom/cm$^2$ to about 3E19 atom/cm$^2$. In some embodiments, second doping portion 122b has a doping concentration in a range from about 2E12 to about 2E19.

Second doping region 124 is formed above first doping region 122. In some embodiments, second doping region 124 is doped with a p-type dopant, such as boron (B) or boron fluorine ($BF_2$). In some embodiments, when first doping region 122 is doped with n-type dopant, substrate 102, second doping region 124 and well region 126 are doped with p-type dopant.

It should be noted that the junctions or boundaries between first doping portion 122a and second doping portion 122b are not clearly defined and but more "blurred" or "gradient". Therefore, the doping profile changes more smoothly, rather than suddenly, from first doping portion 122a to second doping portion 122b. The lateral doping gradient produces a potential gradient to facilitate the transfer of electrons from photosensitive element 120 to the channel below transfer gate electrode layer. Therefore, image lag problem of image sensor device structure 100b is reduced. In addition, it will have more window to fine N/P type photodiode implant to enlarge the dark current and the white pixel window.

FIGS. 3A-3D show cross-sectional representations of various stages of forming image sensor device structure 100b, in accordance with some embodiments of the disclosure. However, it should be noted that FIGS. 3A to 3D have been simplified for the sake of clarity to better understand the inventive concepts of the disclosure. Additional features can be added in image sensor device structure 100b, and some of the features below can be replaced or eliminated.

Figure 3A:
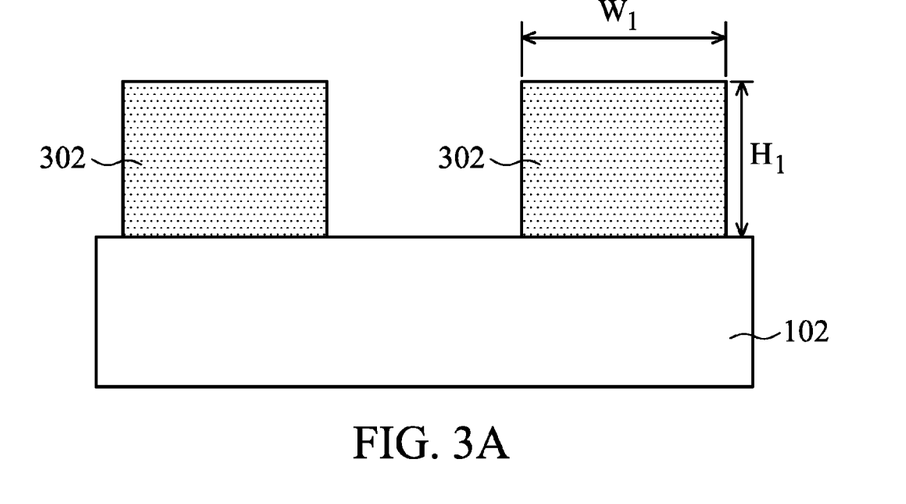
FIGS. 3A-3D show cross-sectional representations of various stages of forming an image sensor device structure, in accordance with some embodiments of the disclosure.

Referring to FIG. 3A, a first photoresist (PR) layer 302 is formed on substrate 102. In some embodiments, first PR layer 302 is formed by a spin-coating method or chemical vapor deposition (CVD) process. In some embodiments, first PR layer 302 has a height $H_1$ in a range from about 2500 A to about 50000 A. In some embodiments, first PR layer 302 has a width $W_1$ in a range from about 0.3 μm to about 3 um.

Figure 3B:
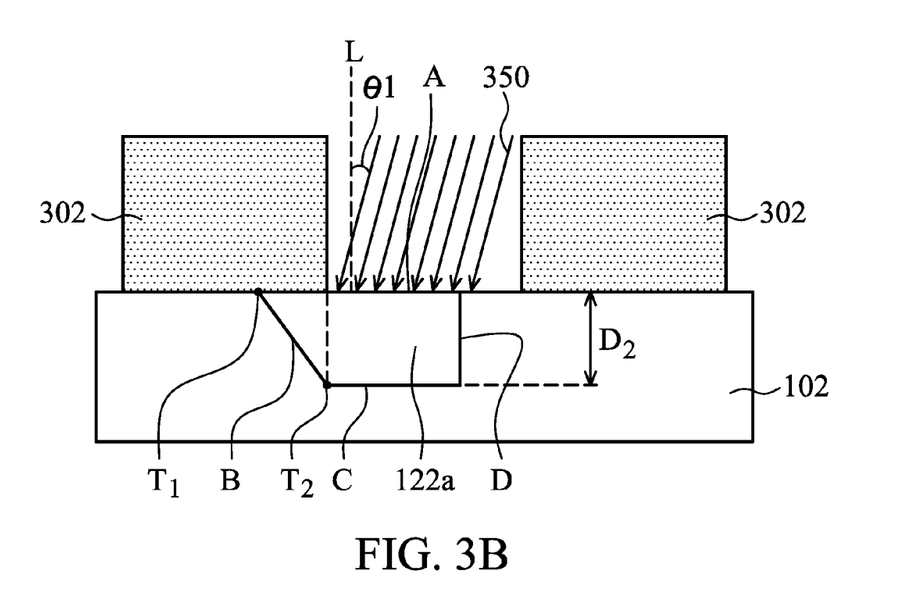

After first PR layer 302 is formed on substrate 102, a first ion implant process 350 is performed to substrate 102 as shown in FIG. 3B in accordance with some embodiments of the disclosure. As a result, first doping portion 122a is formed by using first PR layer 302 as a mask. In some embodiments, an incident angle θ of first ion implant process 350 relative to a line L substantially normal to a front-side of substrate 102 is in a range from about 0 degree to about 60 degree.

In some embodiments, first ion implantation process 350 has an implantation energy in a range from about 50 KeV to about 2500 KeV. In some embodiments, first doped portion 122a is doped with n-type dopants, such as arsenic (As), phosphorous (P) or antimony (Sb). In some embodiments, first doped portion 122a has a concentration in a range from about 3E12 atom/cm$^2$ to about 3E19 atom/cm$^2$. In some embodiments, first doped portion 122a extends from the front-side of substrate 102 to a depth $D_1$ in a range from about 1000 A to about 30000 A.

As shown in FIG. 3B, because ion implant process 350 is performed at the tile angle $θ_1$, first doping portion 122a has a trapezoid shape including facets A, B, C and D. An intersection point $T_1$ between facet A and facet B is formed below first PR layer 302. An intersection point $T_2$ between facet B and facet C is formed in substrate 102.

It should be noted that intersection point $T_1$ may be designed to be as close to transfer gate electrode layer 114 as possible to improve the transfer of electrons. If transfer gate electrode layer 114 is formed after first doping region 122, transfer gate electrode layer 114 may be designed to form above intersection point $T_1$ to facilitate the transfer of electrons. Alternatively, if transfer gate electrode layer 114 is formed before first doping region 122, transfer gate electrode layer 114 may be used as an aligned target to form intersection point $T_1$ below transfer gate electrode layer 114.

In some embodiments, after first ion implant process 350, a rapid thermal annealing (RTA) process (not shown) is performed to activate the implanted dopant ions in first doping portion 122a. The RTA process is performed at a temperature in a range from about 500° C. to about 1100° C. As a result of the RTA process, first doping portion 122a may diffuse or expand laterally into regions of substrate 102 below transfer transistor 110.

Figure 3C:
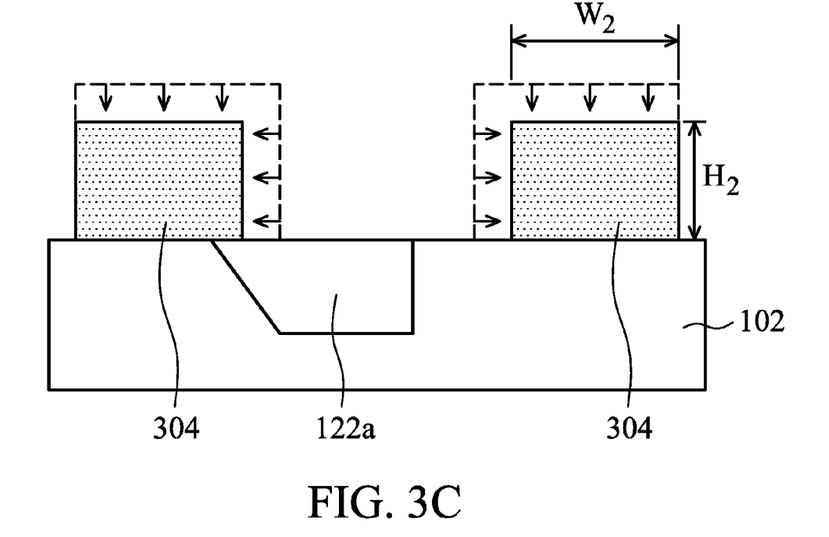

After first doping portion 122a is formed, first PR layer 302 is reduced to form a second PR layer 304 as shown in FIG. 3C in accordance with some embodiments of the disclosure.

Second PR layer 304 is reduced to have smaller dimensions with a height $H_2$ and a width $W_2$. In some embodiments, the height $H_2$ is in a range from about 1500 A to about 49000 A. In some embodiments, the width $W_2$ is in a range from about 0.2 μm to about 3 μm.

A shown in FIG. 3C, the dimensions of first PR layer 302 represented by the dotted line is reduced to that of second PR layer 304 represented by the solid line. The advantage is that second PR layer 304 is formed by using the same PR layer without forming another or extra mask.

Second PR layer 304 is formed by using a dry etching process. In some embodiments, the dry etching process includes using an etching gas, such as helium (He), argon (Ar), oxygen ($O_2$), nitrogen ($N_2$), carbon fluoride ($CF_4$), or methyl fluoride ($CH_3F$).

Figure 3D:
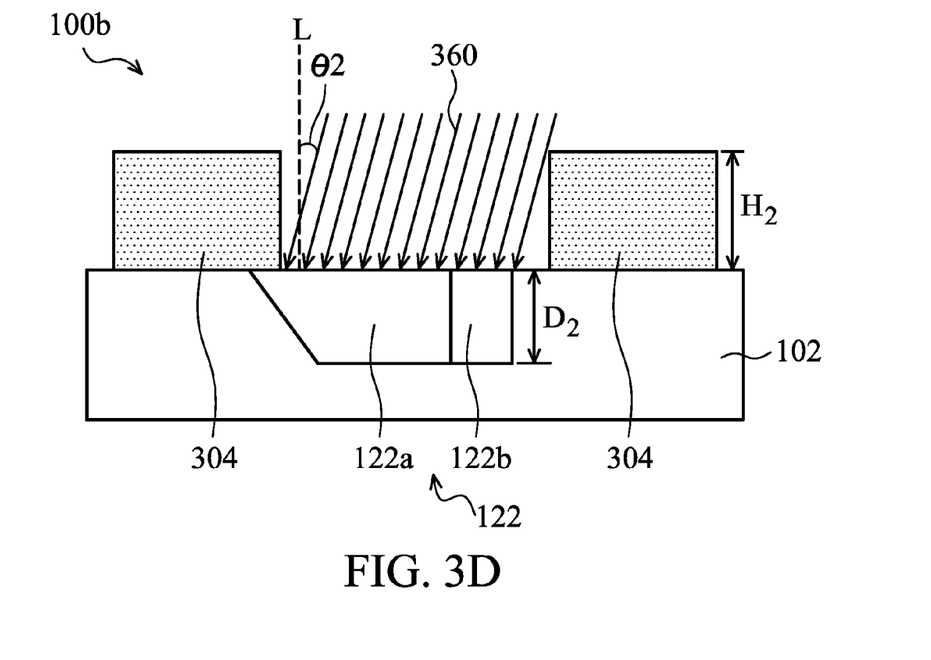

After second PR layer 304 is formed, second ion implant process 360 is performed to substrate 102 as shown in FIG. 3D in accordance with some embodiments of the disclosure. As a result, second doping portion 122b is formed by using second PR layer 304 as a mask. In some embodiments, an incident angle $\theta_2$ of second ion implant process 360 relative to a line L substantially normal to a front-side of substrate 102 is in a range from about 0 degree to about 55 degree. In some embodiments, the incident angle $\theta_2$ of second ion implant process 360 is smaller than that of first ion implant process 350.

In some embodiments, second ion implantation process 360 has an implantation energy in a range from about 50 KeV to about 2500 KeV. In some embodiments, second doped portion 122b is doped with n-type dopants, such as arsenic (As), phosphorous (P) or antimony (Sb). In some embodiments, second doped portion 122b has a concentration in a range from about 2E12 atom/$cm^2$ to about 2E19 atom/$cm^2$. In some embodiments, second doped portion 122b extends from the front-side of substrate 102 to a depth $D_2$ in a range from about 1000 A to about 30000 A. In some embodiments, the depth $D_2$ is substantially equal to the depth $D_1$.

It should be noted that first doping portion 122a is doped again by second ion implant process 360, and therefore the concentration of first doping portion 122a is higher than that of second doping portion 122b after second ion implant process 360 is performed.

In some embodiments, after second ion implant process 360 is performed, a rapid thermal annealing (RTA) process (not shown) is performed to activate the implanted dopant ions in first doping portion 122a and second doping portion 122b.

It should be noted that there are no clear junctions or boundaries between first doping portion 122a and second doping portion 122b. The doping gradient changes more smoothly, rather than suddenly, from first doping portion 122a to second doping portion 122b. A continuous potential level is produced by forming a lateral doping gradient, and no sharp barrier is formed between first doping portion 122a and second doping portion 122b. Therefore, the electrons are easily transferred from second doping portion 122b to first doping portion 122a by the lateral doping gradient.

Figure 4A:
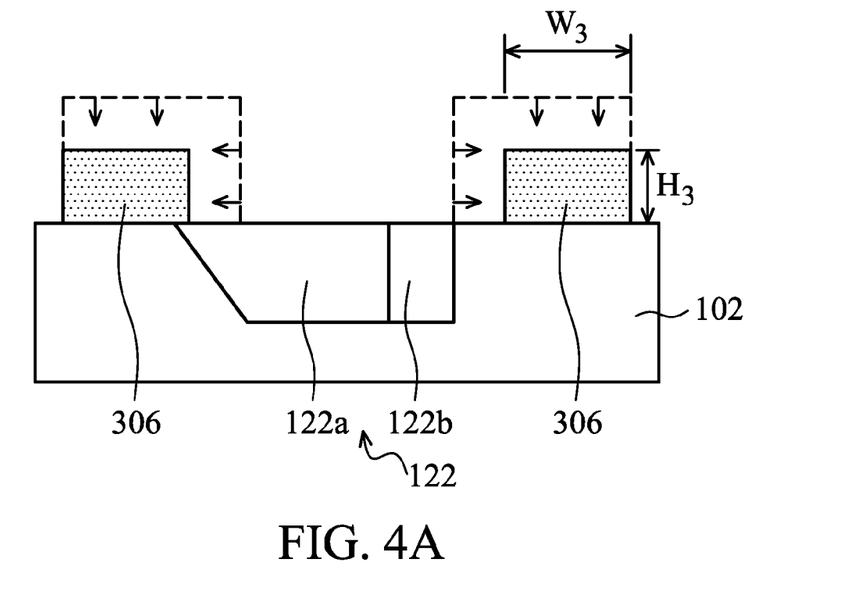
FIGS. 4A-4B show cross-sectional representations of various stages of forming an image sensor device structure, in accordance with some embodiments of the disclosure.
Figure 4B:
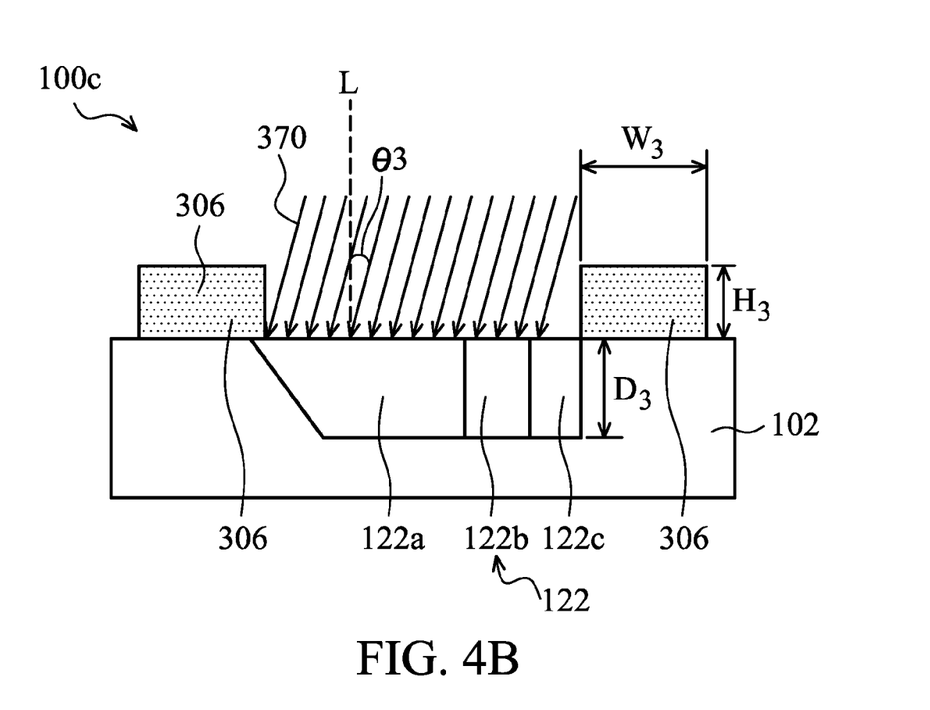

FIGS. 4A-4B show cross-sectional representations of various stages of forming an image sensor device structure 100c, in accordance with some embodiments of the disclosure.

Referring to FIG. 4A, the processing of image sensor device structure 100b is continued with the following operations to form image sensor device structure 100c. Similar to second PR layer 304, third PR layer 306 is formed by reducing the dimensions of second PR layer 304. In some embodiments, second PR layer 304 is reduced by using a dry etching process. In some embodiments, the dry etching process includes using an etching gas, such as helium (He), argon (Ar), oxygen ($O_2$), nitrogen ($N_2$), carbon fluoride ($CF_4$), or methyl fluoride ($CH_3F$).

As shown in FIG. 4A, third PR layer 306 has smaller dimensions, with a height $H_3$ and a width $W_3$. In some embodiments, the height $H_3$ is in a range from about 1000 A to about 48000 A. In some embodiments, the width $W_3$ is in a range from about 0.1 μm to about 3 μm.

It should be noted that third PR layer 306 is formed by reducing the dimensions of second PR layer 304, and no extra mask is needed. Therefore, the fabrication time and cost for fabricating third PR layer 306 are reduced.

After third PR layer 306 is formed, a third ion implant process 370 is performed to form a third doping portion 122c as shown in FIG. 4B in accordance with some embodiments of the disclosure. Third doping portion 122c is adjacent to second doping portion 122b, and second doping portion 122b is formed between first doping portion 122a and third doping portion 122c.

In some embodiments, an incident angle $\theta_3$ of third ion implant process 370 relative to a line L substantially normal to a front-side of substrate 102 is in a range from about 0 to about 45 degree. In some embodiments, the incident angle $\theta_3$ of second ion implant process 370 is smaller than that of first ion implant process 350 and that of second ion implant process 360.

In some embodiments, third ion implantation process 370 has an implantation energy in a range from about 50 KeV to about 2500 KeV. In some embodiments, third doped portion 122c is doped with n-type dopants, such as arsenic (As), phosphorous (P) or antimony (Sb). In some embodiments, third doped portion 122c has a concentration in a range from about 1E12 atom/$cm^2$ to about 1E19 atom/$cm^2$. In some embodiments, third doped portion 122c extends from the front-side of substrate 102 to a depth $D_3$ in a range from about 1000 A to about 30000 A. In some embodiments, the depth $D_3$ is substantially equal to the depth $D_2$.

It should be noted that second doping portion 122b is doped twice by second ion implant process 360 and third ion implant process 370, and first doping portion 122a is doped three times by first ion implant process 350, second ion implant process 360 and third ion implant process 370. Therefore, the concentration of first doping portion 122a is higher than that of second doping portion 122b after third ion implant process 370 is performed. The concentration of second doping portion 122b is higher than that of third doping portion 122c after third ion implant process 370 is performed.

As described above, there are no clearly junctions or boundaries between first doping portion 122a and second doping portion 122b, and between second doping portion 122b and third doping portion 122c. The smoothly lateral doping gradient is formed by first doping portion 122a, second doping portion 122b and third doping portion 122c.

FIGS. 5A-5D show cross-sectional representations of various stages of forming an image sensor device structure 100d, in accordance with some embodiments of the disclosure. Image sensor device structure 100d in FIGS. 5A to 5D is similar to image sensor device structure 100c in FIGS. 4A to 4B; the difference between them is that transfer transistor 110 is formed before formation of first doping region 122.

Figure 5A:
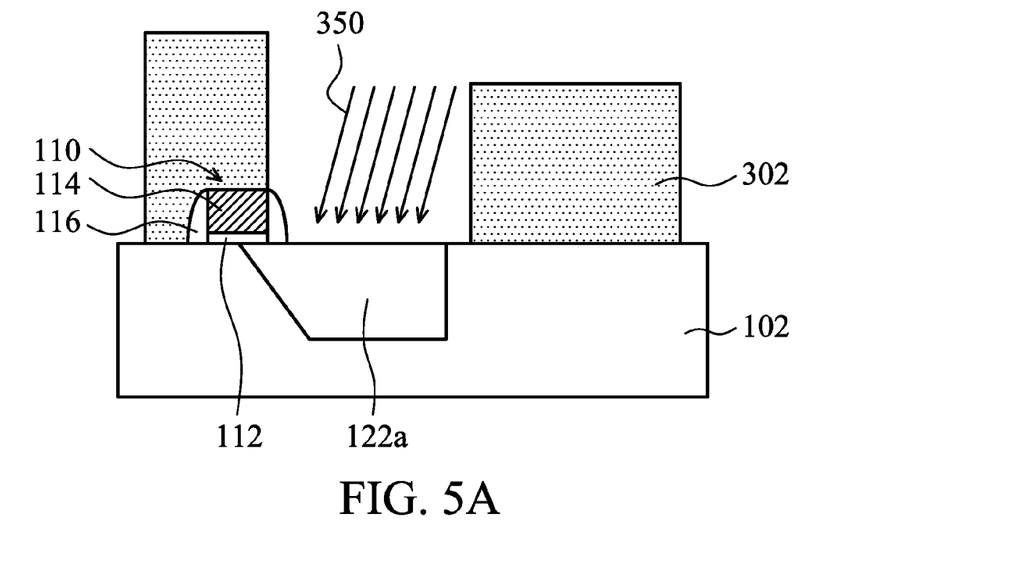
FIGS. 5A-5D show cross-sectional representations of various stages of forming an image sensor device structure, in accordance with some embodiments of the disclosure.

Referring to FIG. 5A, transfer transistor 110 is formed on substrate 102, and first PR layer 302 is formed on transfer transistor 110 and substrate 102. Afterwards, first ion implant process 350 is performed to substrate 102 to form first doping portion 122a. It should be noted that transfer transistor 110 and first PR layer 302 both are used as a mask. Therefore, the regions of substrate 102 below transfer transistor 110 are doped.

As mentioned above, first doping portion 122a is as close to transfer transistor 110 as possible to improve the transfer of electrons. It should be noted that because transfer transistor 110 is used as a mask, first doping portion 122a is approximately aligned with an outer boundary of transfer transistor 110. Therefore, first doping portion 122a is close to transfer transistor 110, and the electrons transferred from first doping portion 122a to a channel below transfer transistor 110 are easily controlled by transfer transistor 110.

Figure 5B:
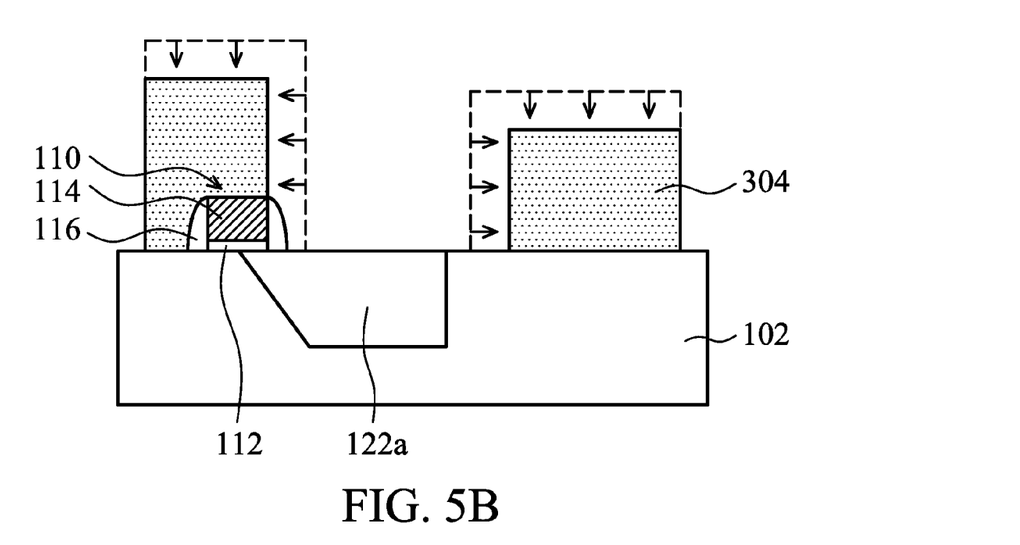

After first doping portion 122a is formed, first PR layer 302 is reduced to form a second PR layer 304 as shown in FIG. 5B in accordance with some embodiments of the disclosure. Second PR layer 304 is formed by reducing the dimensions of first PR layer 302, and therefore fabrication time and cost are reduced.

Figure 5C:
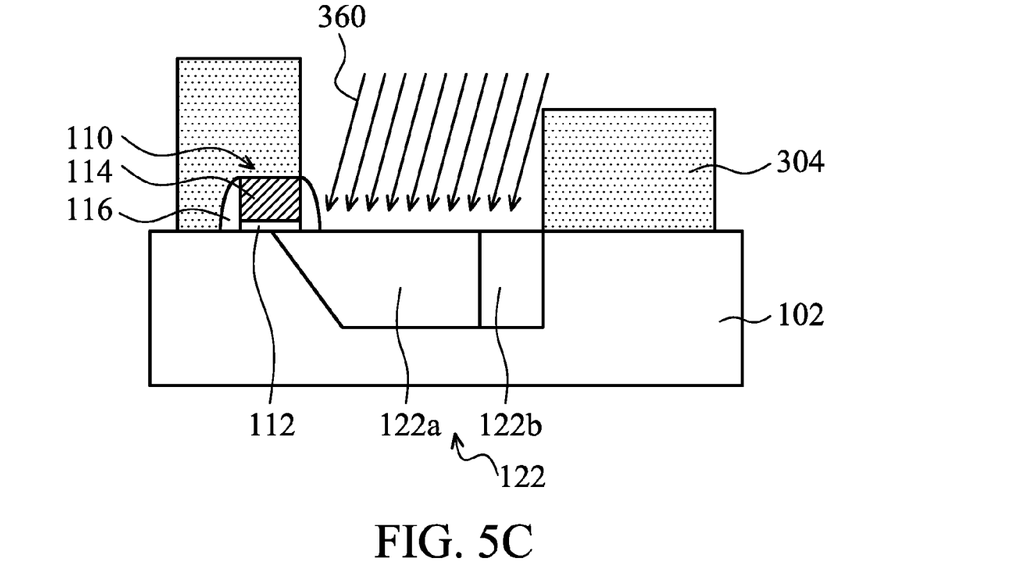

After second PR layer 304 is formed, second ion implant process 360 is performed to substrate 102 as shown in FIG. 5C in accordance with some embodiments of the disclosure. The operation conditions of second ion implant process 360 in FIG. 5C is like that in FIG. 3D, and therefore are omitted for brevity. As a result, second doping portion 122b is formed by using second PR layer 304 as a mask.

As shown in FIG. 5C, a lateral doping gradient is constructed by first doping portion 122a and second doping portion 122b. In addition, first doping region 122 has a doping concentration decreasing from a first doping portion 122a below transfer transistor 110 to a second doping portion 122b away from transfer transistor 110.

Figure 5D:
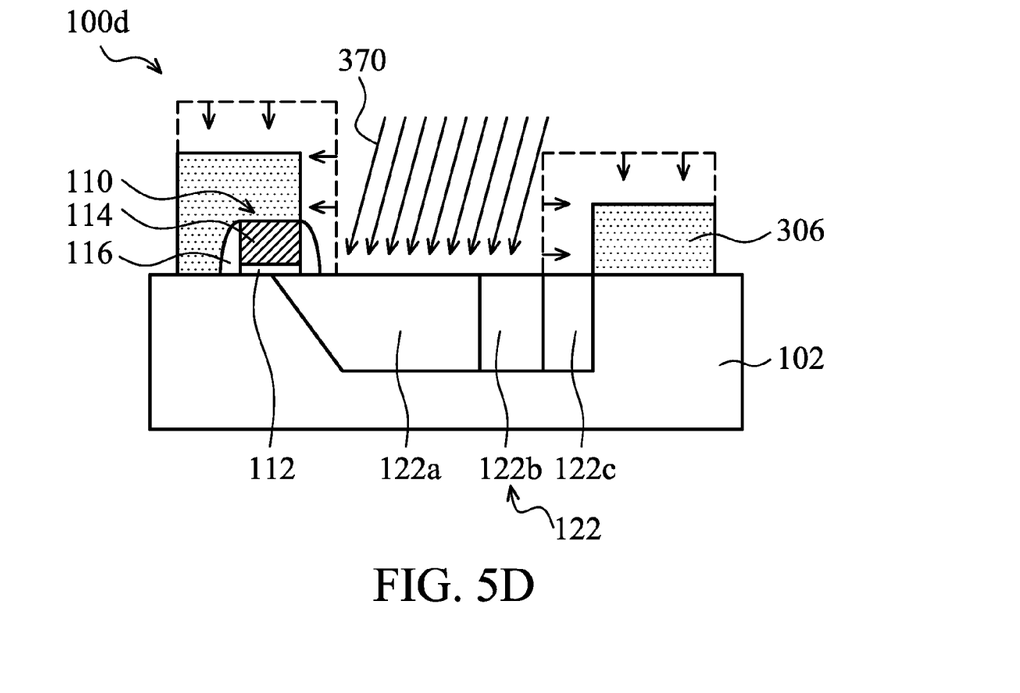

After second doping portion 122b is formed, third PR layer 306 is formed by reducing the dimensions of second PR layer 304 as shown in FIG. 5D in accordance with some embodiments of the disclosure. Afterwards, third ion implant process 370 is performed to form third doping portion 122c.

As shown in FIG. 5D, first doping region 122 is constructed by first doping portion 122a, second doping portion 122b and third doping portion 122c. Second doping portion 122b is formed between first doping portion 122a and third doping portion 122c. In addition, first doping region 122 has a lateral doping gradient. More specifically, first doping portion 122a has the highest concentration, and third doping portion 122c has the lowest doping concentration.

In some embodiments, a fourth ion implant process or fifth ion implant process is performed to produce more doping portions. It should be noted that the first doping region 122 may have several doping portions, and the doping concentration is decreasing from the portion close to transfer transistor 110 to the portion far away from transfer transistor 110.

Afterwards, substrate 102 may continue with other processes to form other devices, such as floating node (FD) 130, second doping region 124 or well region 126. The advantages of the disclosure are that first doping region 122 has a lateral doping gradient to resolve the image lag problem. In addition, first doping portion, second doping portion and third doping portion are formed by using the same PR layer with different dimensions. Therefore, fabrication time and cost are reduced.

Embodiments of mechanisms for forming image sensor device structure are provided. The image sensor device structure has a first doping region doped with a first conductivity type (e.g. n-type) which is surrounded by a second doping region doped with a second conductivity type (e.g. p-type) and a substrate doped with the second conductivity type (e.g. p-type). The first doping region has a lateral doping gradient. More specifically, the first doping region has a doping concentration decreasing from a first doping portion below a transfer transistor to a second doping portion away from a transfer transistor. The lateral doping gradient facilitates the transfer of the electrons. Therefore, the image lag problem of the image sensor device structure is reduced. In addition, the dark current and the white pixel defects are also reduced.

In some embodiments, an image sensor device structure is provided. The image sensor device structure includes a substrate and a transfer transistor formed on the substrate. The image sensor device structure also includes a floating node formed in the substrate and a photosensitive element formed in the substrate. The transfer transistor is formed between the floating node and the photosensitive element, and the photosensitive element includes a first doping region with a lateral doping gradient.

In some embodiments, an image sensor device structure is provided. The image sensor device structure includes a substrate and a floating node formed in the substrate. The image sensor device structure includes a photosensitive element formed in the substrate, and the photosensitive element includes a first doping region, and the first doping region has a lateral doping gradient. The image sensor device structure further includes a transfer transistor formed on the substrate, and the transfer transistor has a transfer gate. The transfer transistor is formed between the floating node and the photosensitive element, and the first doping region is approximately aligned with an outer boundary of the transfer transistor.

In some embodiments, a method for forming an image sensor device structure is provided. The method includes providing a substrate and forming a first photoresist (PR) layer on the substrate. The method also includes forming a first doping region in the substrate by using the first PR layer as a first mask and reducing the first PR layer to form a second PR layer. The method further includes forming a second doping region in the substrate by using the second PR layer as a second mask, and a lateral doping gradient is constructed by the first doping region and the second doping region.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An image sensor device structure, comprising:
a substrate;
a transfer transistor formed on the substrate;
a floating node formed in the substrate; and
a photosensitive element formed in the substrate, wherein the transfer transistor is formed between the floating node and the photosensitive element, the photosensitive element comprises a first doping region with a lateral doping gradient, the first doping region has a doping portion directly below a gate electrode of the transfer transistor, and a width of the doping portion decreases from a top of the doping portion to a bottom of the doping portion, wherein the first doping region comprises;
a first doping portion formed below the transfer transistor;
a second doping portion formed adjacent to the first doping portion and further away from the transfer transistor than the first doping portion is; and
a third doping portion formed adjacent to the second doping portion and further away from the transfer transistor than the second doping portion is,
wherein the first doping portion, the second doping portion and the third doping portion have the same depth but different doping concentrations, and the first doping region has a doping concentration decreasing from the first doping portion to the second doping portion and further to the third doping portion;
a well region formed in the substrate; and
an isolation structure embedded in the well region, and the photosensitive element is formed in a region between the transfer transistor and the well region.

2. The image sensor device structure as claimed in claim 1, wherein the substrate is doped with a first conductivity type, and the first doping region is doped with a second conductivity type.

3. The image sensor device structure as claimed in claim 1, wherein the photosensitive element further comprises a second doping region, and the second doping region is formed above the first doping region.

4. The image sensor device structure as claimed in claim 1, wherein the photosensitive element comprises a photodiode, partially pinned photodiode, pinned photodiode, photogate, or photocapacitor.

5. The image sensor device structure as claimed in claim 1, wherein the well region is in direct contact with the first doping region.

6. The image sensor device structure as claimed in claim 1, wherein the photosensitive element further comprises:
a second doping region formed above the first doping region, wherein the second doping region is in direct contact with the well region.

7. An image sensor device structure, comprising:
a substrate, wherein the substrate is doped with a first conductivity type;
a floating node formed in the substrate;
a well region formed in the substrate;
an isolation structure embedded in the well region;
a photosensitive element formed in the substrate, wherein the photosensitive element comprises a first doping region, and the first doping region has a lateral doping gradient, and the first doping region is doped with a second conductivity type; and
a transfer transistor formed on the substrate, wherein the transfer transistor has a transfer gate,
wherein the transfer transistor is formed between the floating node and the photosensitive element, the first doping region is approximately aligned with an outer boundary of the transfer transistor, the first doping region has a doping portion directly below a gate electrode of the transfer transistor, and a width of the doping portion decreases from a top of the doping portion to a bottom of the doping portion, and
wherein the first doping region comprises:
a first doping portion formed below the transfer transistor;
a second doping portion formed adjacent to the first doping portion and further away from the transfer transistor than the first doping portion is; and
a third doping portion formed adjacent to the second doping portion and further away from the transfer transistor than the second doping portion is,
wherein the first doping portion, the second doping portion and the third doping portion have-the same depth but different doping concentrations, and the first doping region has a doping concentration decreasing from the first doping portion to the second doping portion and further to the third doping portion; and
wherein the photosensitive element is formed in a region between the transfer transistor and the well region, and the well region is in direct contact with the first doping region.

8. The image sensor device structure as claimed in claim 7, wherein the photosensitive element further comprises a second doping region, and the second doping region is formed above the first doping region.

9. The image sensor device structure as claimed in claim 8, wherein the first doping region and the second doping region respectively have different doping conductivity types.

10. A method for forming an image sensor device structure, comprising:
forming a first photoresist (PR) layer on a substrate;
forming a first doping region in the substrate through a first opening of the first PR layer by performing a first ion implant process to the substrate with a first incident angle relative to a line substantially normal to a front-side of the substrate;
reducing the first PR layer to form a second PR layer having a second opening; and
forming a second doping region having a same depth as the first doping region in the substrate through the second opening greater than the first opening by performing a second ion implant process to the substrate with a second incident angle smaller than the first incident angle, wherein the second incident angle is relative to the line substantially normal to the front-side of the substrate, the first incident angle and the second incident angle are both acute angles measured in a clockwise direction from a same first side of the line substantially normal to the front-side of the substrate, and wherein a lateral doping gradient is constructed by the first doping region and the second doping region.

11. The method as claimed in claim 10, after forming the second doping region in the substrate, further comprising:

reducing the second PR layer to form a third PR layer; and forming a third doping region having the same depth as the first doping region and the second doping region in the substrate by using the third PR layer as a third mask and performing a third ion implant process to the substrate with a third incident angle relative to the line substantially normal to the front-side of the substrate, wherein the third incident angle is smaller than the second incident angle, the third incident angle is an acute angle measured in the clockwise direction from the same first side of the line substantially normal to the front-side of the substrate.

12. The method as claimed in claim 11, wherein a doping concentration decreases from the first doping portion to the second doping portion and further to the third doping portion.

13. The method as claimed in claim 10, wherein reducing the first PR layer is performed by using a dry etching process.

14. The method as claimed in claim 13, wherein the dry etching process comprises using an etching gas, and the etching gas comprises helium (He), argon (Ar), oxygen ($O_2$), nitrogen ($N_2$), carbon fluoride ($CF_4$), or methyl fluoride ($CH_3F$).

15. The method as claimed in claim 10, wherein the first incident angle is in a range from about 0 degrees to about 60 degrees, and the second incident angle is in a range from about 0 degrees to about 55 degrees.

16. The method as claimed in claim 10, before forming the first PR layer on the substrate, further comprising:

forming a transfer transistor on the substrate.

17. The method as claimed in claim 10, wherein a doping concentration decreases from the first doping portion to the second doping portion.

* * * * *